United States Patent
Albini

(10) Patent No.: US 9,728,449 B2
(45) Date of Patent: *Aug. 8, 2017

(54) SEMICONDUCTOR DEVICE STRUCTURES WITH IMPROVED PLANARIZATION UNIFORMITY, AND RELATED METHODS

(71) Applicant: Micron Technology, Inc., Boise, ID (US)

(72) Inventor: Giulio Albini, Boise, ID (US)

(73) Assignee: Micro Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/080,060

(22) Filed: Mar. 24, 2016

(65) Prior Publication Data

US 2016/0204022 A1 Jul. 14, 2016

Related U.S. Application Data

(60) Continuation of application No. 14/739,452, filed on Jun. 15, 2015, now Pat. No. 9,343,669, which is a
(Continued)

(51) Int. Cl.
*H01L 47/00* (2006.01)
*H01L 45/00* (2006.01)
(Continued)

(52) U.S. Cl.
CPC .... *H01L 21/7684* (2013.01); *H01L 21/76816* (2013.01); *H01L 21/76879* (2013.01);
(Continued)

(58) Field of Classification Search
CPC ... H01L 31/0324; H01L 45/04; H01L 45/141; H01L 27/108; H01L 27/11529; H01L 27/24; H01L 2924/055
See application file for complete search history.

(56) References Cited

U.S. PATENT DOCUMENTS 6,340,611 B1 1/2002 Shimizu et al.
8,058,637 B2 11/2011 Nam
(Continued)

FOREIGN PATENT DOCUMENTS

CN 102646638 A 8/2012
JP 2012033839 A 2/2012
(Continued)

OTHER PUBLICATIONS

Korean Office Action from Korean Patent Application No. 10-2016-7010502, dated Aug. 16, 2016, 11 pages with English Translation.
(Continued)

*Primary Examiner* — Hoai V Pham
(74) *Attorney, Agent, or Firm* — TraskBritt

(57) ABSTRACT

Semiconductor devices and structures, such as phase change memory devices, include peripheral conductive pads coupled to peripheral conductive contacts in a peripheral region. An array region may include memory cells coupled to conductive lines. Methods of forming such semiconductor devices and structures include removing memory cell material from a peripheral region and, thereafter, selectively removing portions of the memory cell material from the array region to define individual memory cells in the array region. Additional methods include planarizing the structure using peripheral conductive pads and/or spacer material over the peripheral conductive pads as a planarization stop material. Yet further methods include partially defining memory cells in the array region, thereafter forming peripheral conductive contacts, and thereafter fully defining the memory cells.

18 Claims, 9 Drawing Sheets

Related U.S. Application Data division of application No. 14/038,164, filed on Sep. 26, 2013, now Pat. No. 9,082,966.

(51) Int. Cl.
  *H01L 27/24* (2006.01)
  *H01L 21/768* (2006.01)
  *H01L 23/522* (2006.01)
  *H01L 23/528* (2006.01)

(52) U.S. Cl.
  CPC ........ *H01L 23/528* (2013.01); *H01L 23/5226* (2013.01); *H01L 27/2409* (2013.01); *H01L 27/2436* (2013.01); *H01L 27/2463* (2013.01); *H01L 27/2481* (2013.01); *H01L 45/06* (2013.01); *H01L 45/065* (2013.01); *H01L 45/12* (2013.01); *H01L 45/1253* (2013.01); *H01L 45/16* (2013.01); *H01L 45/126* (2013.01); *H01L 45/1233* (2013.01); *H01L 45/144* (2013.01); *H01L 45/1675* (2013.01)

(56) References Cited

U.S. PATENT DOCUMENTS

| | | | |
|---|---|---|---|
| 8,395,935 | B2 | 3/2013 | Lung et al. |
| 8,598,010 | B2 | 12/2013 | Joo et al. |
| 8,614,135 | B2 | 12/2013 | Eun et al. |
| 9,082,966 | B2 | 7/2015 | Albini |
| 2002/0038877 | A1 | 4/2002 | Ichige et al. |
| 2002/0105088 | A1* | 8/2002 | Yang ................. H01L 21/76801 257/774 |
| 2006/0292812 | A1* | 12/2006 | Jung .................. H01L 27/0207 438/381 |
| 2007/0173010 | A1 | 7/2007 | Lee et al. |
| 2011/0263093 | A1 | 10/2011 | Joo et al. |
| 2012/0220087 | A1 | 8/2012 | Suh |
| 2012/0228574 | A1 | 9/2012 | Park et al. |
| 2012/0305872 | A1 | 12/2012 | Yoon |
| 2013/0026439 | A1 | 1/2013 | Bae et al. |
| 2013/0040408 | A1 | 2/2013 | Nam et al. |
| 2013/0134378 | A1 | 5/2013 | Liu |
| 2013/0153852 | A1 | 6/2013 | Park et al. |
| 2014/0284713 | A1 | 9/2014 | Kutsukake et al. |
| 2015/0083986 | A1 | 3/2015 | Albini |

FOREIGN PATENT DOCUMENTS

| | | |
|---|---|---|
| KR | 1020100090969 A | 8/2010 |
| KR | 1020110118356 A | 10/2011 |
| KR | 1020130012385 A | 2/2013 |
| KR | 1020130071006 A | 6/2013 |

OTHER PUBLICATIONS

International Search Report, ISA/KR, International Application No. PCT/US2014/054273, Dec. 15, 2014, three (3) pages.
Taiwanese Office Action and Search Report for Taiwan Application No. 103132519 dated Nov. 27, 2015, 7 pages.
Written Opinion of the International Searching Authority, ISA/KR, International Application No. PCT/US2014/054273, Dec. 15, 2014, six (6) pages.
International Preliminary Report on Patentability of the International Searching Authority, ISA/KR, International Application No. PCT/US2014/054273, Mar. 29, 2016, seven (7) pages.
Chinese Office Action and Search Report from Chinese Patent Application No. 201480052485.7, dated Jan. 4, 2017, 11 pages with English Translation.
Korean Office Action from Korean Patent Application No. 10-2016-7010502, dated Dec. 30, 2016, 8 pages with English Translation.

\* cited by examiner

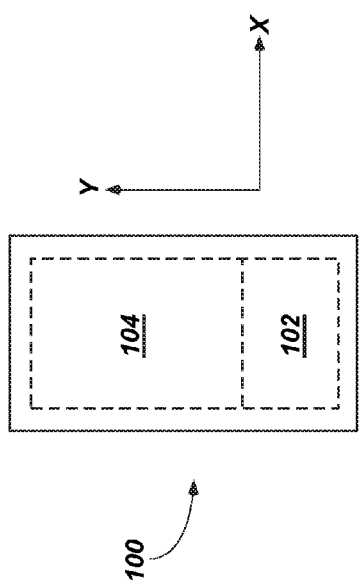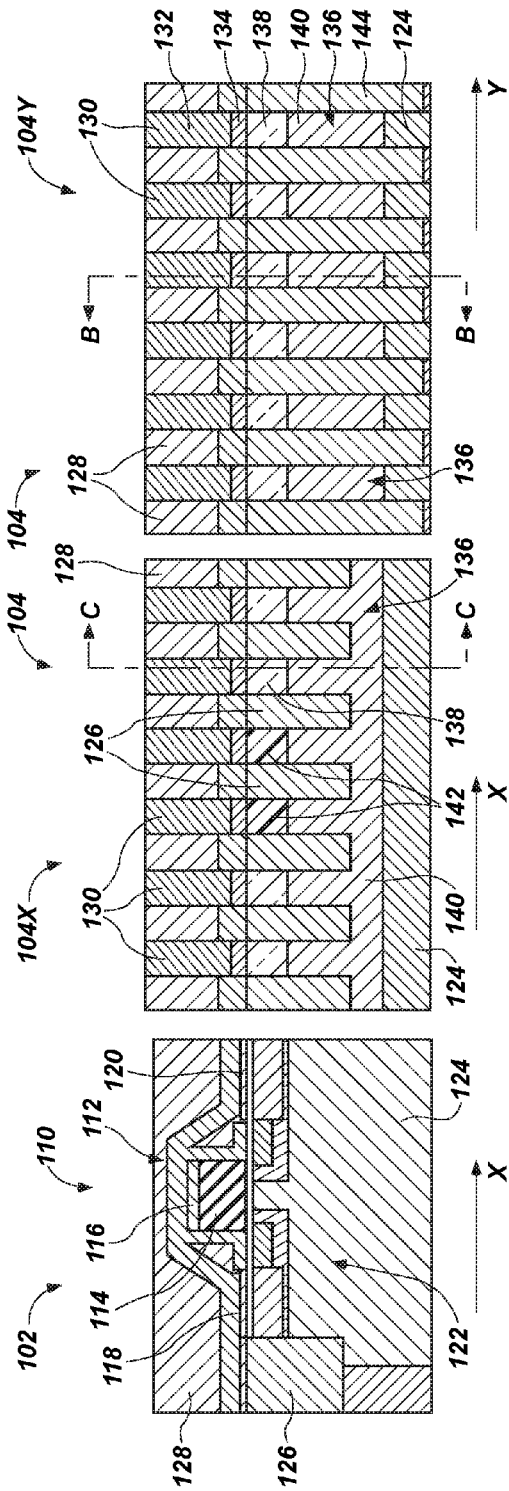

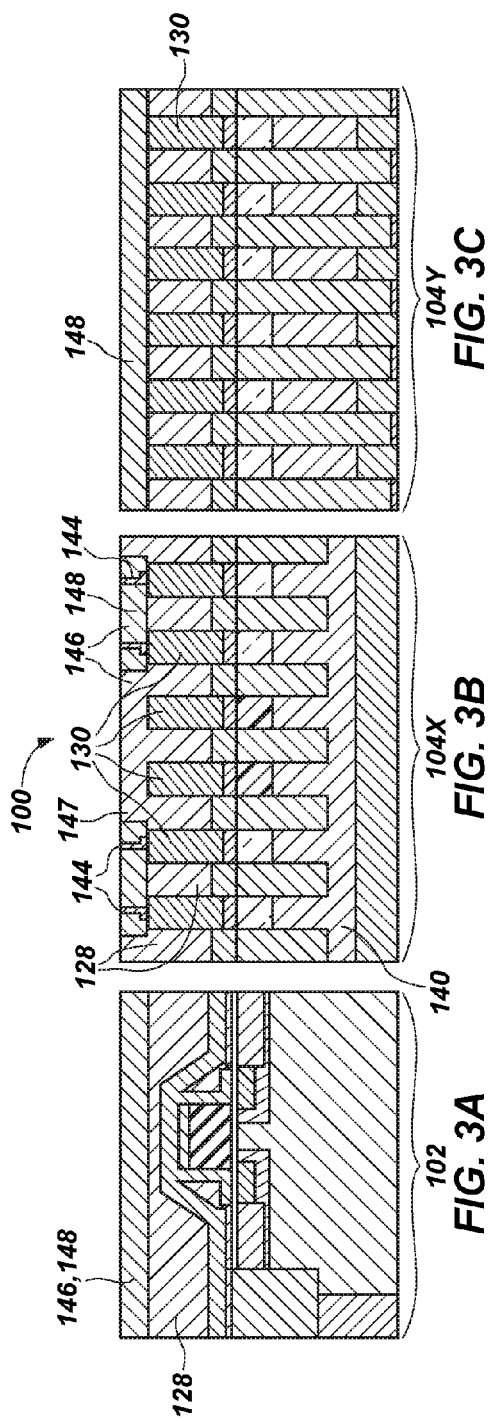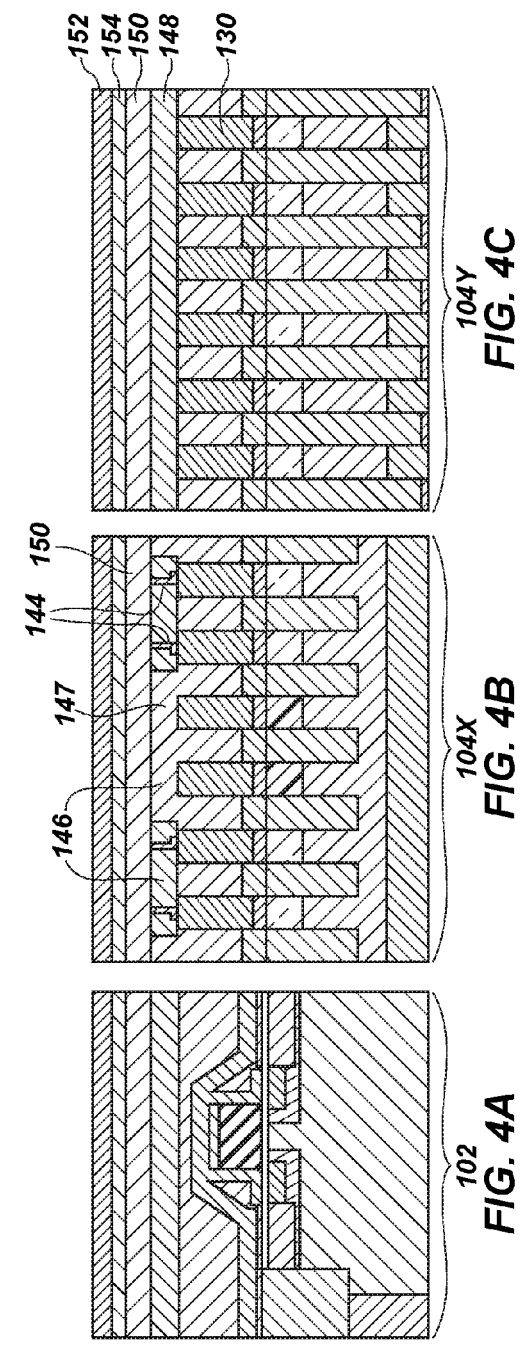

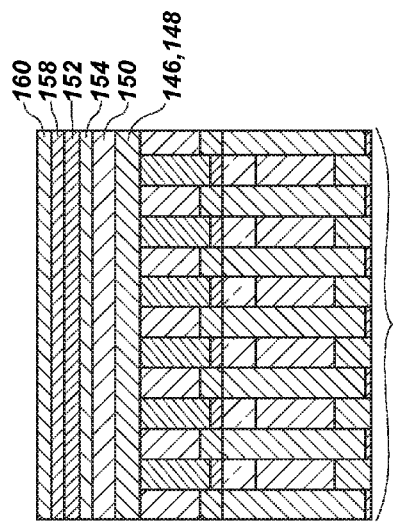
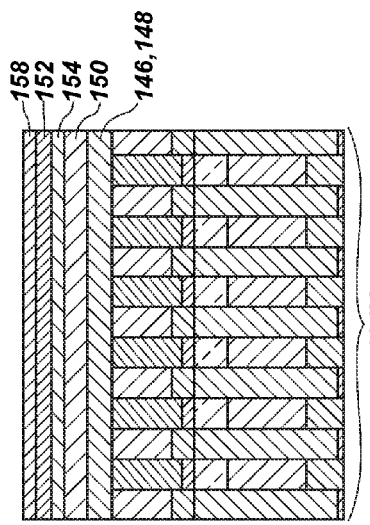
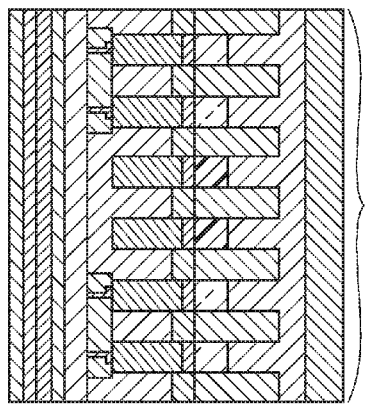
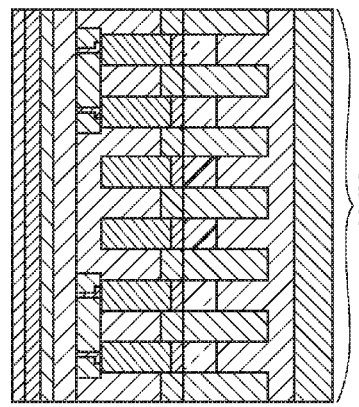
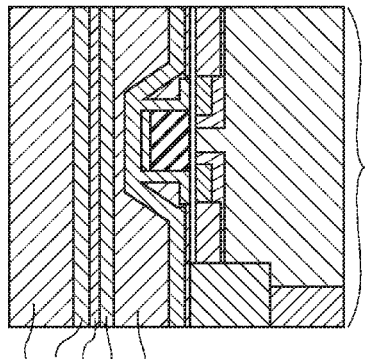
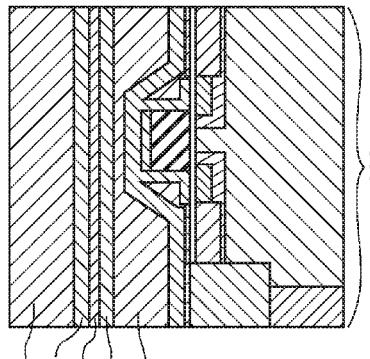

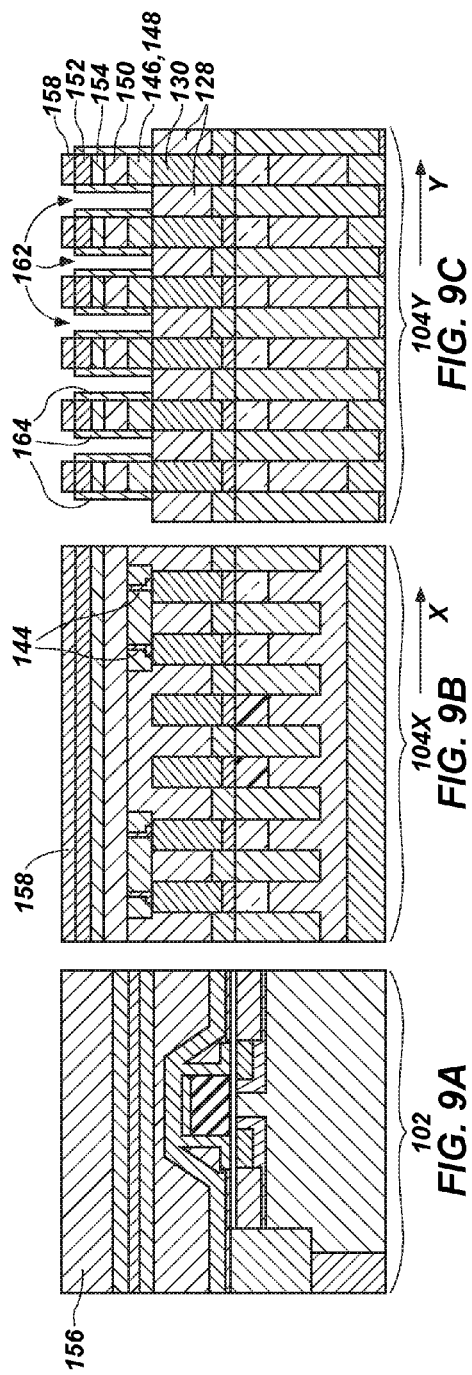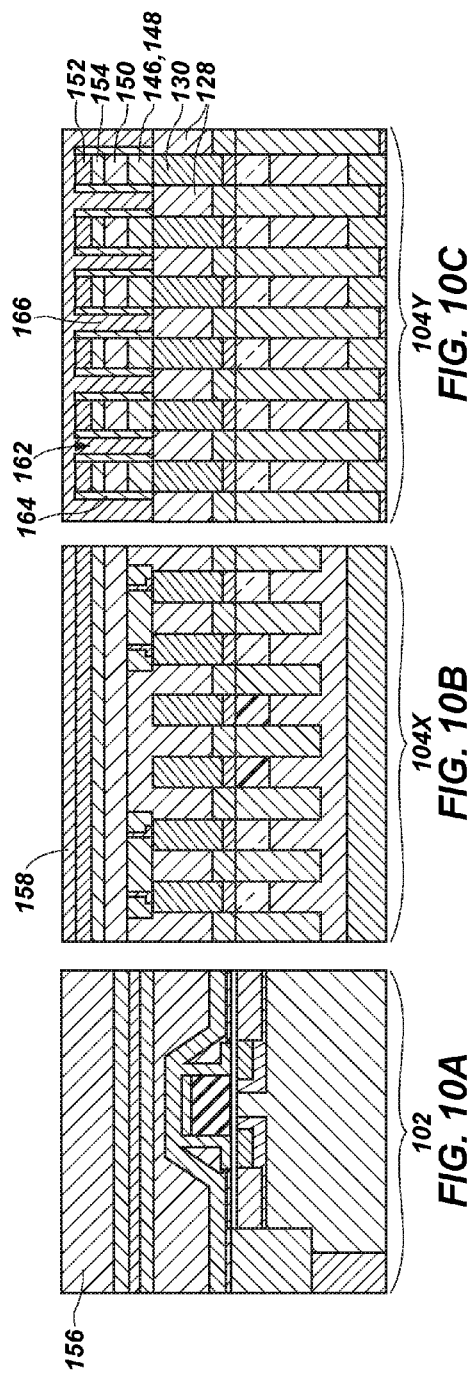

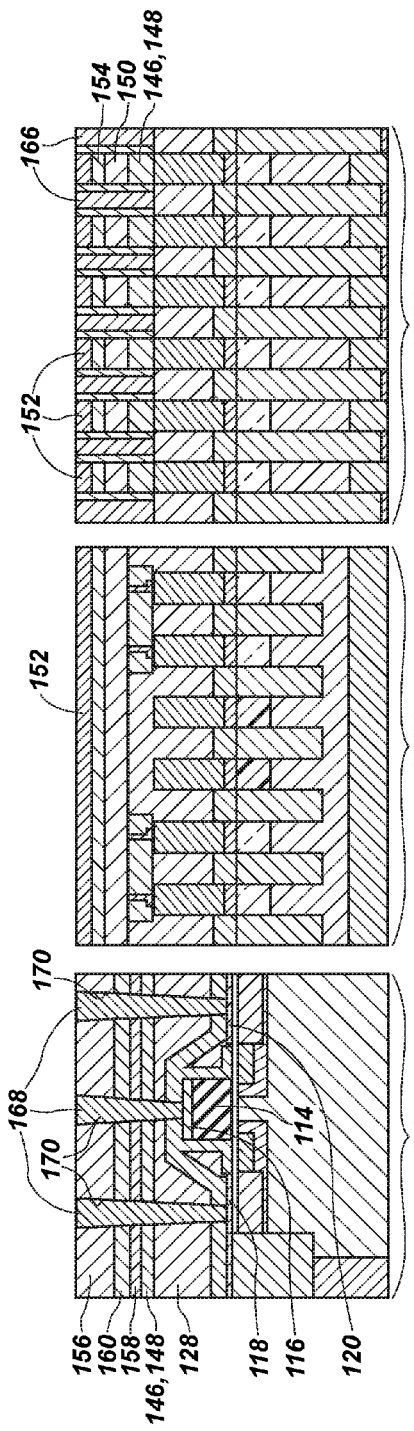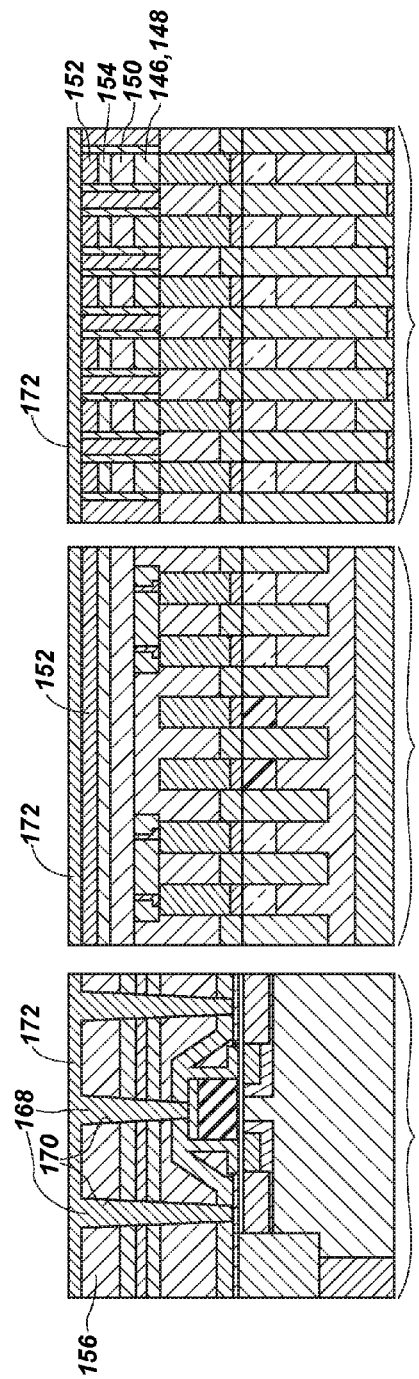

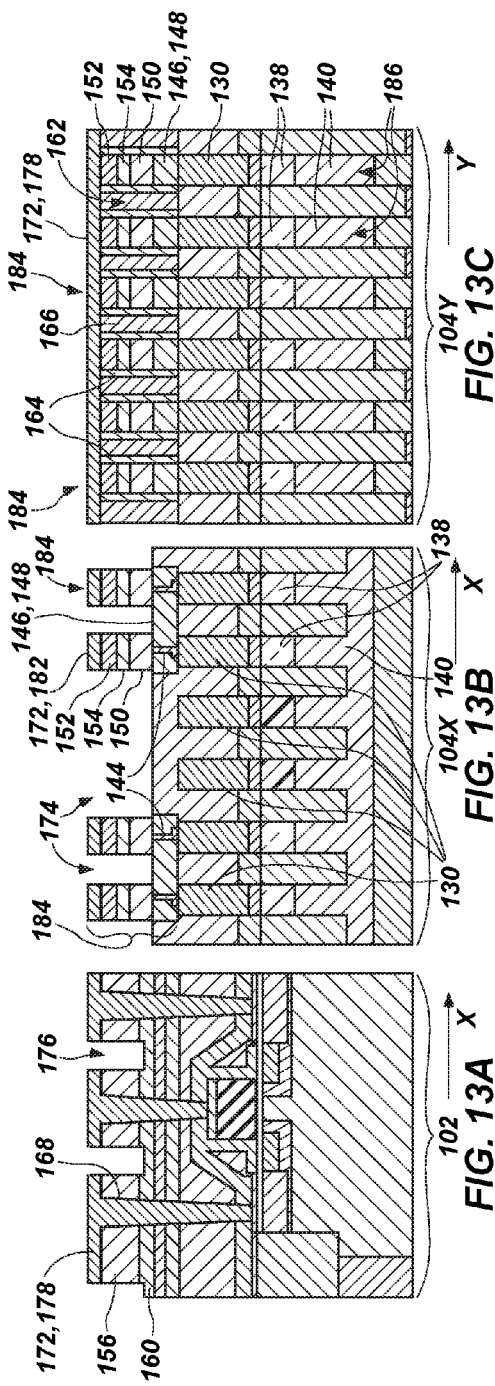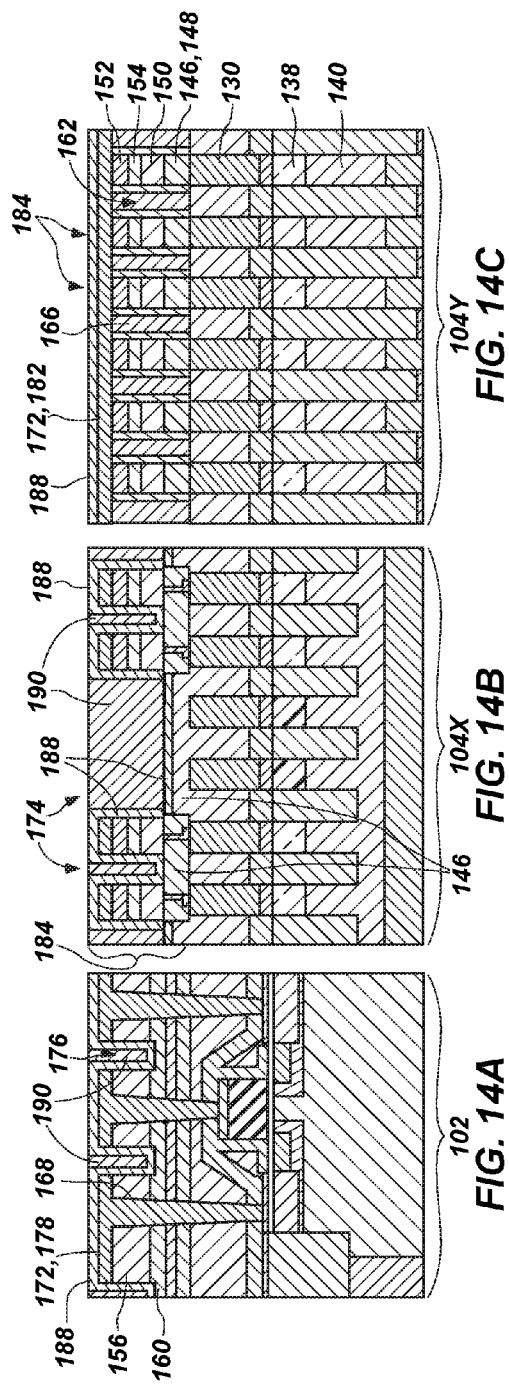

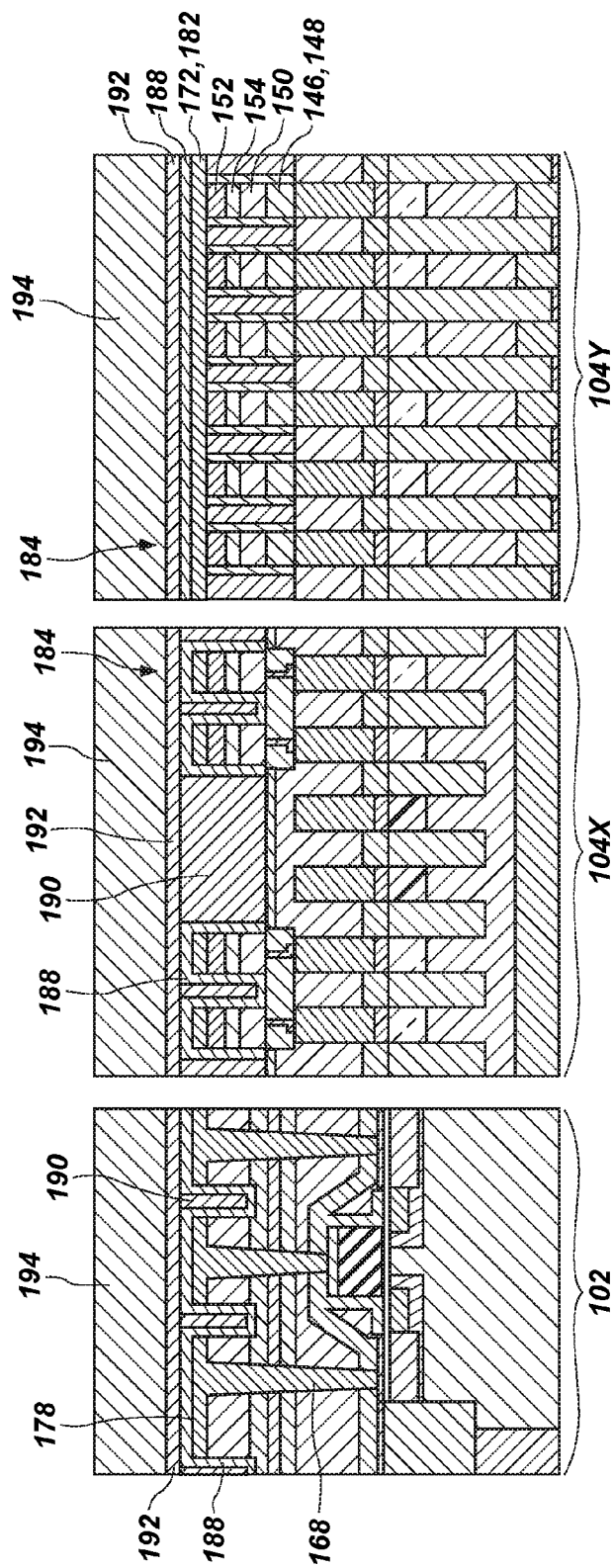

SEMICONDUCTOR DEVICE STRUCTURES WITH IMPROVED PLANARIZATION UNIFORMITY, AND RELATED METHODS

CROSS-REFERENCE TO RELATED APPLICATIONS

This application is a continuation of U.S. patent application Ser. No. 14/739,452, filed Jun. 15, 2015, now U.S. Pat. No. 9,343,669, issued May 17, 2016, which is a divisional of U.S. patent application Ser. No. 14/038,164, filed Sep. 26, 2013, now U.S. Pat. No. 9,082,966, issued Jul. 14, 2015, the disclosure of each of which is hereby incorporated herein in its entirety by this reference.

TECHNICAL FIELD

Embodiments of the present disclosure relate to methods of forming semiconductor devices including peripheral regions and array regions with improved planarization uniformity, as well as to semiconductor devices and structures that are formed by such methods.

BACKGROUND

Many semiconductor devices include peripheral regions with relatively larger peripheral features (e.g., control circuitry) and array regions with relatively smaller array features (e.g., memory cells). During the manufacture of such semiconductor devices, both the peripheral regions and array regions are often planarized simultaneously, such as by performing an abrasive planarization operation in the form of a chemical-mechanical planarization (CMP) operation. For example, in forming a phase change memory (PCM) device, array features are formed in the array region, after which material used to form the array features (e.g., cell material) is removed from the peripheral region. A filler material is formed in the peripheral region, and both the peripheral region and array region are planarized through a single CMP operation in preparation for forming some of the peripheral features.

Due to non-uniformity in thickness of the filler material in the peripheral region, non-uniformity in thickness of the array region and the peripheral region prior to the CMP operation, there is a significant risk of the CMP operation removing too much or too little material in the array region. For example, removing too much material in the array region may damage the array features, resulting in contamination of memory cell material, and causing performance failures. In addition, removing too much material in the array region may result in unwanted electrical shorts between the array features, which also causes performance failures. Similar defects and failures may be a result of removing too little material in the array region. Thus, improvements in uniformity of planarization in the manufacturing of semiconductor devices are desired.

BRIEF DESCRIPTION OF THE DRAWINGS

FIG. 1 illustrates a plan view of a semiconductor device including a peripheral region and an array region according to an embodiment of the present disclosure.

FIGS. 2A through 16C illustrate a method of forming a semiconductor device according to an embodiment of the present disclosure.

FIGS. 2A-2C illustrate cross-sectional views of a semiconductor device structure according to an embodiment of the present disclosure, including a cross-sectional view of a peripheral region of the semiconductor device structure (FIG. 2A), a cross-sectional view of an array region of the semiconductor device structure taken in a first direction (i.e., x-direction) through line B-B (FIG. 2B), and a cross-sectional view of the array region taken in a second direction (i.e., y-direction) orthogonal to the first direction through line C-C (FIG. 2C). Each of FIGS. 3A through 16C also illustrate similar corresponding cross-sectional views.

FIGS. 3A-3C illustrate cross-sectional views of the semiconductor device structure of FIGS. 2A-2C after heating elements have been formed over conductive contacts.

FIGS. 4A-4C illustrate cross-sectional views of the semiconductor device structure of FIGS. 3A-3C after memory cell material and cell contact material have been formed over the structure.

FIGS. 7A-7C illustrate cross-sectional views of the semiconductor device structure of FIGS. 6A-6C after portions of the filler material have been removed from the peripheral region and the array region.

FIGS. 8A-8C illustrate cross-sectional views of the semiconductor device structure of FIGS. 7A-7C after a chemical-mechanical planarization (CMP) stop material has been removed from the array region.

FIGS. 9A-9C illustrate cross-sectional views of the semiconductor device structure of FIGS. 8A-8C after material has been selectively removed to form first array trenches extending in the x-direction.

FIGS. 10A-10C illustrate cross-sectional views of the semiconductor device structure of FIGS. 9A-9C after a second spacer material and a second filler material have been formed in the first array trenches.

FIGS. 11A-11C illustrate cross-sectional views of the semiconductor device structure of FIGS. 10A-10C after peripheral conductive contacts have been formed.

FIGS. 12A-12C illustrate cross-sectional views of the semiconductor device structure of FIGS. 11A-11C after a conductive pad material has been formed over the structure.

FIGS. 13A-13C illustrate cross-sectional views of the semiconductor device structure of FIGS. 12A-12C after material has been selectively removed to form second array trenches extending in the y-direction and to form peripheral trenches.

FIGS. 14A-14C illustrate cross-sectional views of the semiconductor device structure of FIGS. 13A-13C after a second spacer material and a third filler material have been formed in the second array trenches and peripheral trenches.

FIGS. 15A-15C illustrate cross-sectional views of the semiconductor device structure of FIGS. 14A-14C after a blocking material and an upper contact isolation material have been formed over the structure.

FIGS. 16A-16C illustrate cross-sectional views of the semiconductor device structure of FIGS. 15A-15C after upper conductive contacts have been formed.

DETAILED DESCRIPTION

Figure 5A:
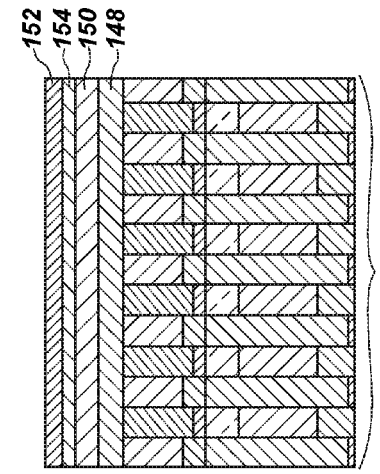
FIGS. 5A-5C illustrate cross-sectional views of the semiconductor device structure of FIGS. 4A-4C after the memory cell material, cell contact material, and heating element isolation material have been removed from the peripheral region.

The following description provides specific details, such as material types, processing techniques, and processing conditions in order to provide a thorough description of embodiments of the present disclosure. However, a person of ordinary skill in the art will understand that the embodiments of the present disclosure may be practiced without employing these specific details, or with employing additional techniques and processes not described in detail in the present disclosure. Indeed, the embodiments of the present disclosure may be practiced in conjunction with conventional fabrication techniques employed in the industry.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The materials described herein may be formed by any suitable technique including, but not limited to, spin coating, blanket coating, chemical vapor deposition (CVD), plasma enhanced CVD, atomic layer deposition (ALD), plasma enhanced ALD, or physical vapor deposition (PVD), unless otherwise specified. Depending on the specific material and structure to be formed, the technique for depositing, growing, or otherwise forming the material may be selected by a person of ordinary skill in the art. While the materials described and illustrated herein may be formed as layers, the materials are not limited thereto and may be formed in other three-dimensional configurations.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, the phrase "semiconductor device structure" means and includes a structure, device, or system used in the formation of a semiconductor device and which may or may not be present in the semiconductor device in its final form. For example, a semiconductor device structure may be an intermediate structure present in the formation of a semiconductor device or system or a final structure comprising at least a portion of a semiconductor device or system. "Semiconductor device structure" encompasses structures for memory, logic, solar cells, light emitting diodes (LEDs), processors, imaging devices, and other devices and systems that may or may not include one or more semiconductor materials.

As used herein, any relational term, such as "first," "second," "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

As used herein, the phrase "coupled to" refers to elements operatively connected with each other, such as electrically connected through a direct ohmic connection or through an indirect connection (e.g., via another element).

Semiconductor devices (e.g., resistive random access memory (RRAM) devices, phase change memory (PCM) devices, conductive bridging memory devices, magnetoresistive random access memory (MRAM) devices, NAND Flash memory devices, dynamic random access memory (DRAM) devices) and structures including an array region with relatively densely packed and smaller features and a peripheral region including relatively less densely packed and larger features are disclosed, as are methods of forming such devices and structures. The semiconductor devices of the present disclosure may include conductive pads over peripheral contacts. The conductive pads may provide a surface area greater than the peripheral contacts themselves for aligning an upper contact thereto. In addition, the conductive pads may improve planarization of the semiconductor device structure during manufacturing of the semiconductor device by reducing the potential for removing too little or too much material during the planarization operation.

The methods of the present disclosure may include removing a memory cell material from over the peripheral region prior to fully defining memory cells in the array region. Peripheral contacts may be formed in the peripheral region, and a conductive pad material may be formed over the peripheral contacts and over the memory cells in the array region. Conductive pads may be formed from the conductive pad material in the peripheral region, and the structure may be planarized after the formation of the conductive pads. The conductive pads may provide a sufficient surface area for improved control of the planarization operation. In addition, the conductive pads may have a relatively larger upper surface area than the peripheral contacts, for improved tolerances and increased electrical contact area.

While the semiconductor devices and structures described herein by way of example may make specific reference to PCM devices, the disclosure is not so limited and may be applied to other semiconductor and memory devices. For example, embodiments of the disclosure may be implemented in RRAM devices, MRAM devices, conductive bridging memory devices, NAND Flash memory devices, DRAM devices, or any semiconductor device or system that may benefit from improved planarization and from the alternative structures described in the present disclosure.

FIG. 1 illustrates a plan view of a semiconductor device structure 100 including a peripheral region 102 and an array region 104. The semiconductor device structure 100 may be a single chip (e.g., a die) of a plurality of chips (e.g., dice) formed concurrently on a semiconductor substrate.

The peripheral region 102 may be adjacent to the array region 104. In some embodiments, the peripheral region 102 may be adjacent to and below the array region 104 when viewed in the perspective of FIG. 1. However, in other embodiments, the peripheral region 102 may be to the left of, to the right of, or above the array region 104. In further embodiments, the peripheral region 102 may be positioned on more than one side (i.e., two, three, or all four sides) of the array region 104. Accordingly, the semiconductor device structure 100 of the present disclosure is not limited to the particular example layout shown in FIG. 1.

For purposes of this description, a first direction may be defined as the left-to-right direction when viewed in the perspectives of FIG. 1. The first direction is also designated herein as the x-direction, as shown in FIG. 1. A second direction may be defined as the up-and-down direction when viewed in the perspectives of FIG. 1. The second direction may be orthogonal to the first direction. The second direction is also designated herein as the y-direction, as shown in FIG. 1. As will be apparent upon consideration of the following description, in embodiments in which the peripheral region 102 is not positioned below the array region 104 from the perspective of FIG. 1, the x-direction and the y-direction may be defined as two orthogonal directions that are different from those shown in FIG. 1. Accordingly, the x-direction and the y-direction are used herein for convenience in describing the example embodiments, but the first and second directions of the present disclosure are not limited to the particular directions shown in FIG. 1.

The peripheral region 102 may include peripheral elements and features (e.g., circuitry) for operating (e.g., selecting, writing, erasing, reading, programming, etc.) array features (e.g., memory cells) of the array region 104. The peripheral elements of the peripheral region 102 may be larger and/or more widely spaced (i.e., may have a greater pitch) than the array features of the array region 104. The peripheral elements may be coupled to respective array features to enable operation thereof.

FIGS. 2A through 16C illustrate an embodiment of a method of forming a semiconductor device structure, using a PCM device as an example of the semiconductor device structure, according to the present disclosure. As noted above, however, the methods of the present disclosure may be applied to other types of semiconductor devices and structures, such as RRAM devices, MRAM devices, conductive bridging memory devices, NAND Flash memory devices, and DRAM devices.

FIGS. 2A-2C illustrate cross-sectional views of a semiconductor device structure 100 according to the present disclosure, including a cross-sectional view of a peripheral region 102 of the semiconductor device structure 100 (FIG. 2A), a cross-sectional view of an array region 104 of the semiconductor device structure 100 taken in a first direction (i.e., x-direction) through line B-B (FIG. 2B), and a cross-sectional view of the array region 104 taken in a second direction (i.e., y-direction) orthogonal to the first direction through line C-C (FIG. 2C). The cross-sectional view of the array region 104 taken in the x-direction is referred to herein as the "x-array 104X," and the cross-sectional view of the array region 104 taken in the y-direction is referred to herein as the "y-array 104Y." The x-array 104X and the y-array 104Y are also referred to collectively as the array region 104. Each of FIGS. 3A through 16C illustrate cross-sectional views similar to the corresponding views of FIG. 2A-2C.

The peripheral region 102 includes peripheral circuitry 110 for operation of memory cells to be built in the array region 104. The peripheral circuitry 110 may include, for example, a plurality of transistors 112 (only one of which is shown in FIG. 2A for simplicity), each of which may include a gate 114, a gate contact material 116, a source contact material 118, a drain contact material 120, and an active area 122 including, for example, doped (e.g., n-doped, p-doped) regions of a semiconductor substrate 124. The gate 114 may be formed of a conductive material, such as a polysilicon material. Each of the gate contact material 116, the source contact material 118, and the drain contact material 120 may be formed of one or more conductive materials, such as a metal material, a metal nitride material, or a metal silicide material. An active area isolation material 126 may be disposed between active areas 122 of adjacent transistors 112. A dielectric material 128 may be disposed adjacent to and over the gate 114 to electrically isolate the gate 114 from gates 114 of adjacent transistors 112, and to provide structural support to the transistors 112. The formation of the peripheral circuitry 110, to the point shown in FIG. 2A may be accomplished by conventional processes familiar to one of ordinary skill in the art. Accordingly, details of the formation of the peripheral circuitry 110 to the point shown in FIG. 2A are not provided in the present disclosure.

The array region 104 shown in FIGS. 2B and 2C may include lower conductive contacts 130, such as for reading, writing, and erasing individual memory cells to be formed over and coupled to the lower conductive contacts 130. In addition, one or more of the lower conductive contacts 130 may provide an electrical contact area for electrically accessing a string of memory cells to be formed. The lower conductive contacts 130 may include one, two, or more than two conductive materials having sufficient electrical conductivity to transmit an electrical signal and apply an appropriate voltage to operate the memory cells to be formed. By way of non-limiting example, the lower conductive contacts 130 may include an upper conductive material 132, such as a metallic material (e.g., copper, tungsten), and a conductive adhesion material 134, such as a metal silicide material (e.g., copper silicide, tungsten silicide, titanium silicide), for improved adhesion between the upper conductive material 132 and an underlying doped semiconductor material (e.g., a silicon material). Of course, other configurations of the lower conductive contacts 130 are included in the present disclosure, including configurations lacking the conductive adhesion material 134. The lower conductive contacts 130 may be electrically isolated from one another by the dielectric material 128, or by another dielectric material different from the dielectric material 128 in the peripheral region 102.

The lower conductive contacts 130 may be coupled to array active areas 136 defined by doped portions 138, 140 of the semiconductor substrate 124. For example, the array active areas 136 may each include a first doped portion 138 and a second doped portion 140. The first and second doped portions 138, 140 may have ions (e.g., phosphorous ions, boron ions, arsenic ions, gallium ions) implanted therein to enable electrons or holes to flow through the first and second doped portions 138, 140 in at least one direction responsive to an appropriate applied voltage, as is known in the art of semiconductor manufacturing. By way of example, the first doped portion 138 may be a doped p-type semiconductor material and the second doped portion 140 may be a doped n-type semiconductor material. Portions of the semiconductor substrate 124 underlying the second doped portion 140 may be doped or not doped, such that the semiconductor material 124 underlying the second doped portion 140 is not electrically conductive. A third doped portion 142 may be located under at least one of the lower conductive contacts 130 in place of the first doped portion 138, such as under at least one of the lower conductive contacts 130 that is to be used for electrically accessing a string of memory cells to be formed, rather than for operating a particular memory cell. The third doped portion 142 may be a doped n-type semiconductor material, for example. An interface between the first doped portion 138 and the second doped portion 140 of each active area 136 and an interface between the third doped portion 142 and the second doped portion 140 may define a diode across which holes or electrons may flow in one direction, but not in an opposite direction, for selecting and operating certain memory cells to be formed.

The active areas 136 of the array region 104 may be electrically isolated from each other by the active area isolation material 126, which may be the same material as or a different material from the active area isolation material 126 of the peripheral region 102.

The formation of the elements of the array region 104 to the point shown in FIGS. 2B and 2C may be accomplished by conventional processes familiar to one of ordinary skill in the art. Accordingly, details of the formation of the array region 104 and its elements, to the point shown in FIGS. 2B and 2C, are not provided in the present disclosure. In some embodiments, the lower conductive contacts 130 and the active area 136 may be formed by so-called "pitch doubling" techniques to form the lower conductive contacts 130 at a size and with lateral spacing (e.g., a pitch) that is smaller than is possible by conventional photolithographic techniques. For example, the lower conductive contacts 130 of the array region 104 may be formed at a pitch that is smaller than a pitch of the transistors 112 in the peripheral region 102.

FIGS. 3A-3C illustrate cross-sectional views of the semiconductor device structure 100 of FIGS. 2A-2C after heating elements 144 have been formed over at least some of the lower conductive contacts 130. The heating elements 144 may be formed over lower conductive contacts 130 that are to be coupled to respective memory cells to be formed, as will be explained below. The heating elements 144 may be used to change a phase of at least a portion of a phase change material of the memory cells to be formed. The heating elements 144 may be formed of a conventional heating material, such as titanium silicon nitride and/or titanium nitride, for example. The heating elements 144 may be electrically isolated from each other by a heating element isolation material 146. The heating element isolation material 146 may be a single material or more than one material, such as an oxide material 147 (e.g., silicon oxide) and a nitride material 148 (e.g., silicon nitride). The oxide material 147 may be the same as or different from the dielectric material 128 separating the lower conductive contacts 130. The heating element isolation material 146 may be formed in both the array region 104 and in the peripheral region 102. To form the structure shown in FIGS. 3A-3C, excess material forming the heating elements 144 and the heating element isolation material 146 may be removed by, for example, a chemical-mechanical planarization (CMP) operation.

As shown in FIG. 3B, at least one of the lower conductive contacts 130 may lack a heating element 144 thereover. For example, heating elements 144 may not be formed over the two lower conductive contacts 130 illustrated in the center of FIG. 3B. The two lower conductive contacts 130 in the center of FIG. 3B may be for providing electrical access to a string of memory cells coupled to a particular second doped portion 140 extending in the x-direction, rather than for coupling to individual memory cells through heating elements 144.

FIGS. 4A-4C illustrate cross-sectional views of the semiconductor device structure of FIGS. 3A-3C after a memory cell material 150 and a cell contact material 152 have been formed over the structure. In some embodiments, a conductive cell adhesion material 154 may, optionally, be formed between the memory cell material 150 and the cell contact material 152. The memory cell material 150 may be formed over and be coupled to the heating elements 144, as well as over the heating element isolation material 146. The memory cell material 150 may be a PCM cell material, such as germanium antimony tellurium (GeSbTe, "GST"). The cell contact material 152 may be or include any electrically conductive material, such as copper, tungsten, or tungsten nitride. The cell adhesion material 154 may be a conductive material that provides an improved chemical bond between the memory cell material 150 and the cell contact material 152, such as titanium nitride. The memory cell material 150, cell contact material 152, and conductive cell adhesion material 154 (if present) may be formed over both the peripheral region 102 and the array region 104.

Figure 5B:
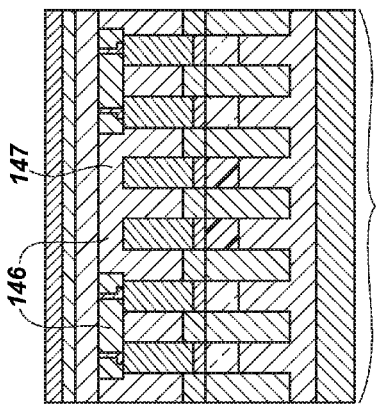
Figure 5C:
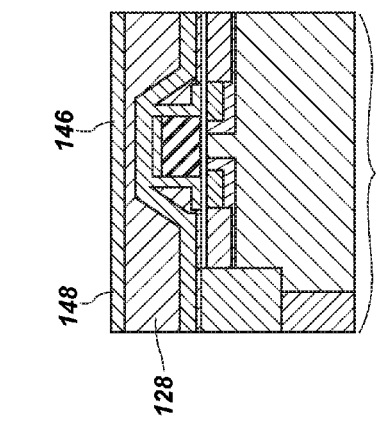

FIGS. 5A-5C illustrate cross-sectional views of the semiconductor device structure of FIGS. 4A-4C after the memory cell material 150, cell contact material 152, and cell adhesion material 154 have been removed from the peripheral region 102, such as by conventional photolithographic and chemical (e.g., wet chemical or dry chemical) etching operations. The chemical etching operation may be tailored to remove at least substantially all of the memory cell material 150, cell contact material 152, and cell adhesion material 154 from the peripheral region 102. Optionally, a portion or all of the heating element isolation material 146 (e.g., a portion of the nitride material 148) may also be removed from the peripheral region 102 to ensure that at least substantially all of the overlying materials are removed.

Figure 6A:
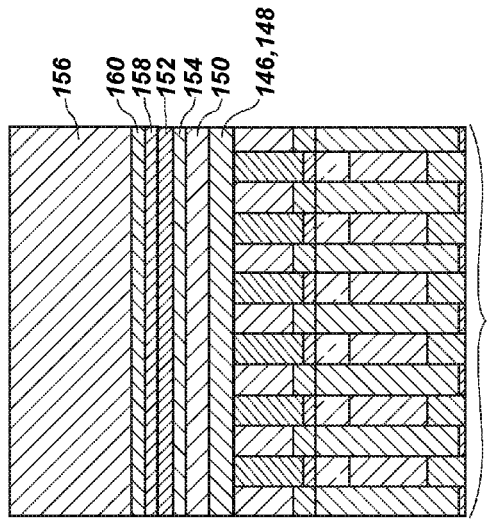
FIGS. 6A-6C illustrate cross-sectional views of the semiconductor device structure of FIGS. 5A-5C after a first filler material has been formed over the structure.
Figure 6B:
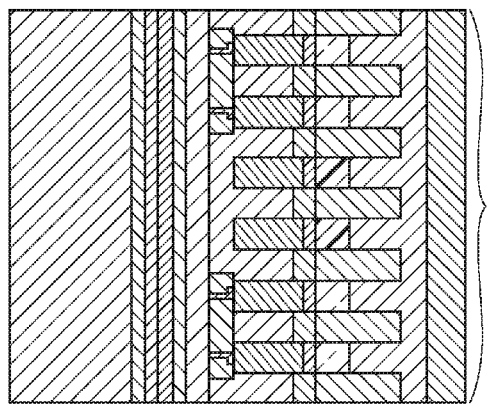
Figure 6C:
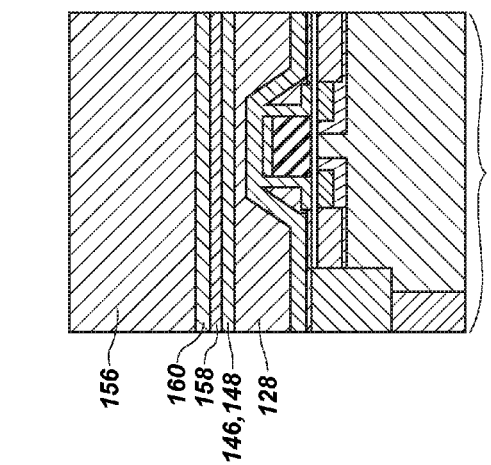

FIGS. 6A-6C illustrate cross-sectional views of the semiconductor device structure of FIGS. 5A-5C after a first filler material 156 has been formed over the structure. The first filler material 156 may be a dielectric material, such as silicon oxide, aluminum oxide, an oxynitride material, etc., such that peripheral conductive contacts to be formed through a portion of the first filler material 156 in the peripheral region 102 (as will be explained below) may be electrically isolated from each other by the first filler material 156. Prior to forming the first filler material 156, an etch stop material 158 may be formed over the cell contact material 152 in the array region 104 (and over the dielectric material 128 and any remaining portion of the heating element isolation material 146 in the peripheral region 102) and a CMP stop material 160 may be formed over the etch stop material 158. The first filler material 156 may be formed over the CMP stop material 160. Since the peripheral conductive contacts to be formed in the peripheral region 102 may also extend through the etch stop material 158 and the CMP stop material 160, the etch stop material 158 and the CMP stop material 160 may also be formed of dielectric materials to maintain electrical isolation of the peripheral conductive contacts to be formed. For example, the etch stop material 158 may be an oxide material (e.g., silicon oxide, aluminum oxide) and the CMP stop material 160 may be a dielectric nitride material (e.g., silicon nitride).

FIGS. 7A-7C illustrate cross-sectional views of the semiconductor device structure of FIGS. 6A-6C after portions of the first filler material 156 have been removed from the peripheral region 102 and the array region 104. For example, the structure may be subjected to a CMP operation to remove at least substantially all of the first filler material 156 from the array region 104, while a portion of the first filler material 156 may remain in the peripheral region 102, as shown in FIGS. 7A-7C. The CMP stop material 160 may provide a stop for the CMP operation for simplified control of the depth that the CMP operation proceeds. For example, the CMP operation may be tailored to slow or stop after a CMP pad and slurry have removed material from over the CMP stop material 160, without substantially removing portions of the CMP stop material 160, as is known in the art of CMP operations. After the CMP operation, upper surfaces of both of the peripheral region 102 and the array region 104 may be at least substantially coplanar.

FIGS. 8A-8C illustrate cross-sectional views of the semiconductor device structure of FIGS. 7A-7C after the CMP stop material 160 has been removed from the array region 102. The CMP stop material 160 may be removed by, for example, a material removal operation that selectively removes the CMP stop material 160 without substantially removing portions of the etch stop material 158 of the array region 104 and/or remaining portions of the first filler material 156 of the peripheral region 102. By way of example and not limitation, the material removal operation performed to remove the CMP stop material 160 from the array region 102 may be a chemical etching operation, such as a dry etching operation or a wet etching operation, as is known in the art of semiconductor manufacturing.

FIGS. 9A-9C illustrate cross-sectional views of the semiconductor device structure of FIGS. 8A-8C after material has been selectively removed to form first array trenches 162 extending in the x-direction. In particular, portions of the etch stop material 158, cell contact material 152, cell adhesion material 154 (if present), memory cell material 150, heating element isolation material 146, and heating elements 144 may be removed to form the first array trenches 162. The first array trenches 162 may be formed by conventional photolithographic techniques, such as by foil ling a mask material over portions of the array region 104 that are not to be removed and patterning the mask material to form openings in the mask material over portions of the array region 104 that are to be removed. An anisotropic material removal (e.g., dry etching) operation may be performed through the openings in the mask material to remove sufficient material to form the first array trenches 162. As shown in FIGS. 9B and 9C, the first array trenches 162 may extend in and out of the page in the y-array 104Y and left and right in the x-array 104X. Accordingly, the first array trenches 162 may extend in the x-direction.

In some embodiments, optionally, the first array trenches 162 may be formed using so-called "pitch doubling" techniques to form the first array trenches 162 at a pitch (i.e., size and spacing) that is smaller than is possible by conventional photolithography techniques alone. "Pitch doubling" techniques are known in the art of semiconductor manufacturing and are, therefore, not described in detail in the present disclosure. In short, "pitch doubling" operations may include the formation and patterning of features (e.g., lines) of a mask material using conventional photolithography, after which a spacer material may be formed on sidewalls of the patterned mask material. The mask material may be removed while the spacer material remains, forming two features (defined by the remaining spacer material) for every one feature initially formed by conventional photolithography. The remaining spacer material may be used as a mask for the formation of elements (e.g., pillars and trenches) in the array region 104 at a smaller pitch than would be possible by conventional photolithography techniques alone. Of course, in some embodiments and depending on the desired pitch of features in the array region 104, "pitch doubling" techniques may not be employed, and conventional photolithography techniques alone may be employed to form the first array trenches 162.

The formation of the first array trenches 162 may partially, but not fully, define memory cells to be formed from the remaining cell contact material 152, memory cell material 150, and heating elements 144. As will be explained in detail below, full definition of the memory cells by removing additional portions of the cell contact material 152 and memory cell material 150 may be completed after formation of additional features in the peripheral region 104.

After material is removed to form the first array trenches 162, a first spacer material 164 may be formed on sidewalls defining the first array trenches 162. The first spacer material 164 may be a dielectric material, such as, for example, a nitride (e.g., silicon nitride) material. The first spacer material 164 may be formed by depositing the first spacer material 164 conformally over the semiconductor device structure, such that the first spacer material 164 covers upper surfaces of the etch stop material 158 in the array region 104, upper surfaces of the first filler material 156 in the peripheral region 102, sidewalls of the cell contact material 152, cell adhesion material 154, memory cell material 150, and heating element isolation material 146 defining the first array trenches 162, and upper surfaces of the dielectric material 128 separating the lower conductive contacts 130 and defining a bottom of the first array trenches 162. Portions of the first spacer material 164 may then be removed from horizontal surfaces (e.g., upper surfaces of the etch stop material 158, upper surfaces of the first filler material 156, upper surfaces of the dielectric material 128) by performing an anisotropic material removal (e.g., dry etching) operation. After the anisotropic material removal operation, the first spacer material 164 may remain at least substantially only on the sidewalls defining the first array trenches 162, as shown in FIG. 9C.

FIGS. 10A-10C illustrate cross-sectional views of the semiconductor device structure of FIGS. 9A-9C after a second filler material 166 has been formed in the first array trenches 162. The second filler material 166 may be a dielectric material, such as an oxide (e.g., silicon oxide, aluminum oxide) material or a nitride (e.g., silicon nitride) material. By way of example and not limitation, in some embodiments, the second filler material 166 may be the same material as the etch stop material 158. After the second filler material 166 is formed in the first array trenches 162, the semiconductor device structure shown in FIGS. 10A-10C may be planarized to remove excess second filler material 166 and to provide the semiconductor device structure with a substantially planar upper surface. After the CMP operation, upper surfaces of both of the peripheral region 102 and the array region 104 may be at least substantially coplanar. The planarization may be performed by, for example, a CMP operation or a chemical etching operation.

FIGS. 11A-11C illustrate cross-sectional views of the semiconductor device structure of FIGS. 10A-10C after peripheral conductive contacts 168 have been formed. Material may be selectively removed from the peripheral region 102 through a mask to form contact holes 170 through the first filler material 156, CMP stop material 160, etch stop material 158, heating element isolation material 146, and dielectric material 128. The material may be removed by performing an anisotropic etching (e.g., dry etching) operation that may be tailored to remove the desired materials, without substantially removing portions of the gate contact material 116, source contact material 118, and drain contact material 120. For example, each of the gate contact material 116, source contact material 118, and drain contact material 120 may be formed of a conductive material, such as cobalt silicide. An etching chemistry used to form the contact holes 170 may be selected to react with and remove portions of the first filler material 156, CMP stop material 160, etch stop material 158, heating element isolation material 146, and dielectric material 128, without substantially reacting with or removing the conductive material of the gate contact material 116, source contact material 118, and drain contact material 120. Thus, the conductive material of the gate contact material 116, source contact material 118, and drain contact material 120 may be exposed through the contact holes 170.

After the contact holes 170 are formed, a conductive material (e.g., a metal, a metal silicide, a metal nitride) may be formed within the contact holes 170 to form the peripheral conductive contacts 168, which may be electrically coupled to the respective gate contact material 116, source contact material 118, and drain contact material 120. By way of example and not limitation, conductive material used to form the peripheral conductive contacts 168 may include one or more of titanium, tungsten, copper, titanium nitride, tungsten nitride, and copper silicide. In one embodiment, the peripheral conductive contacts 168 may be formed of a tungsten material. The conductive material of the peripheral conductive contacts 168 may at least substantially fully fill the contact holes 170.

The formation of the peripheral conductive contacts 168 may leave excess conductive material over the first filler material 156 and over the etch stop material 158 (see FIGS. 10A-10C). Excess conductive material may be removed, along with at least a portion of the first filler material 156 and at least substantially all of the etch stop material 158 in the array region 104, such as by a CMP operation. The CMP operation may expose the cell contact material 152 in the array region 104. The CMP operation may also remove conductive material forming an electrical short between the peripheral conductive contacts 168, to electrically isolate the peripheral conductive contacts 168 from each other. Accordingly, upper exposed surfaces of the peripheral conductive contacts 168 may be at least substantially coplanar with upper exposed surfaces of the cell contact material 152.

FIGS. 12A-12C illustrate cross-sectional views of the semiconductor device structure of FIGS. 11A-11C after a conductive pad material 172 has been formed over the structure. The conductive pad material 172 may be formed and electrically coupled to the peripheral conductive contacts 168 in the peripheral region 102 and to the cell contact material 152 in the array region 104. By way of non-limiting example, the conductive pad material 172 may be or include one or more of copper, copper silicide, tungsten, tungsten nitride, titanium, and titanium nitride.

Alternatively, in some embodiments, an order of at least some of the operations described above in relation to FIGS. 10A through 12C may be altered. By way of example, in some embodiments, the semiconductor device structure shown in FIGS. 10A-10C may be subjected to a CMP operation to remove the etch stop material 158 in the array region 104 and, optionally, a portion of the first filler material 156 in the peripheral region 102, to expose the cell contact material 152 in the array region 104. Next, the semiconductor device structure shown in FIGS. 12A-12C may be formed by forming contact holes 170 in the peripheral region 102 and filling the contact holes 170 with the conductive material to form the peripheral conductive contacts 168. Excess conductive material may remain over the structure (including in the peripheral region 102 and the array region 104) to form the conductive pad material 172, without removing the excess conductive material in the manner described above in relation to FIGS. 11A-11C. Such alternative embodiments may be used to reduce manufacturing time, cost, and/or materials, although the process initially described above in relation to FIGS. 10A through 12C may be used in other embodiments, such as for improved process control.

FIGS. 13A-13C illustrate cross-sectional views of the semiconductor device structure of FIGS. 12A-12C after material has been selectively removed to form second array trenches 174 extending in the y-direction and to form peripheral trenches 176. Conductive pads 178 may be isolated from each other and defined by the peripheral trenches 176 in the peripheral region 102. Conductive lines 182 may be isolated from each other and defined by the second array trenches 174 in the array region 104. The formation of the second array trenches 174 may complete a definition of memory cells 184 in the array region 104.

Conventional photolithography, "pitch doubling" techniques, or a combination thereof may be used to form the second array trenches 174. To form the second array trenches 174, portions of the conductive pad material 172, the cell contact material 152, the cell adhesion material 154, and the memory cell material 150 may be selectively removed (by, for example, an anisotropic dry etching operation) through a mask. In some embodiments, portions of the first spacer material 164 and second filler material 166 in the first array trenches 162 may also be removed, remaining portions of which are shown in the y-array 104Y of FIG. 13C. In other embodiments, one or both of the first spacer material 164 and second filler material 166 may not be removed during the formation of the second array trenches 174. Thus, in such embodiments, the material removal operation used to form the second array trenches 174 may be tailored to selectively remove portions of the conductive pad material 172, the cell contact material 152, the cell adhesion material 154, and the memory cell material 150 without removing portions of the first spacer material 164 and second filler material 166.

To control a depth of the second array trenches 174, the material removal operation used to form the second array trenches 174 may be tailored to not substantially remove portions of the heating element isolation material 146 or the material removal operation may be timed to stop at the desired depth after at least substantially removing the materials as desired. In embodiments in which the material removal operation is tailored to not substantially remove portions of the heating element isolation material 146, the heating element isolation material 146 may function as an etch stop material.

As shown in FIG. 13B, at least one of the second array trenches 174 may be of a different size than other second array trenches 174. For example, the central second array trench 174 in the view of the x-array in FIG. 13B may be relatively larger (e.g., in the x-direction) to accommodate one or more conductive access contacts to be formed and coupled to the two central lower conductive contacts 130, for electrically accessing a string 186 of the memory cells 184, as will be explained below.

After the second array trenches 174 are formed, remaining portions of the conductive pad material 172 in the array region 104 may define the conductive lines 182 (e.g., digit lines, bit lines) for selecting and operating certain memory cells 184. The conductive lines 182 may extend in the y-direction and be coupled to multiple remaining portions of cell contact material 152, as shown in FIGS. 13B and 13C.

The first array trenches 162 and the second array trenches 174 may extend in at least substantially orthogonal directions (e.g., in the x-direction and y-direction, respectively) and may define an array of the memory cells 184 (e.g., PCM cells). Each memory cell 184 of the array may include a portion of the memory cell material 150, a heating element 144, and a portion of the cell contact material 152. In some embodiments, each memory cell 184 may also include a portion of the cell adhesion material 154.

Each of the memory cells 184 may be coupled to a respective lower conductive contact 130 and to a respective conductive line 182. A particular string 186 of memory cells 184 may be defined by memory cells 184 that are aligned in the x-direction and coupled to one another through the contacts 130, the first doped portions 138, and the second doped portion 140. For example, the four memory cells 184 shown in the x-array 104X of FIG. 13B may be at least a part of a single string 186. An electrical signal may be inhibited from passing between the memory cells 184 of a particular string 186 due to the presence of diodes formed at interfaces between the first doped portions 138 and second doped portion 140. Each of the strings 186 may extend in a first direction (e.g., the x-direction) and each of the conductive lines 182 may extend in a second, orthogonal direction (e.g., the y-direction). Thus, a particular memory cell 184 may be selected and operated (e.g., written to, read from, erased) by applying an appropriate voltage between a particular conductive line 182 and a particular string 186 that intersect (from the perspective of a plan view of the semiconductor device structure, i.e., from a top of the page toward a bottom of the page of FIGS. 13A-13C) at the particular memory cell 184.

The conductive pads 178 may be defined by the conductive pad material 172 remaining in the peripheral region 102 after formation of the peripheral trenches 176. Portions of the conductive pad material 172, and, optionally, portions of the first filler material 156, may be selectively removed through a mask (by, for example, a photolithographic and anisotropic etching operation) to form the peripheral trenches 176 and the conductive pads 178. The conductive pads 178 may have an exposed upper surface area that is relatively larger than an upper surface area of the respective peripheral conductive contacts 168. Accordingly, the conductive pads 178 may provide a relatively larger area for coupling with respective upper peripheral contacts to be formed and for improved planarization control, as will be explained below.

To control a depth of the peripheral trenches 176, the material removal operation used to form the peripheral trenches 176 may be tailored to not substantially remove portions of the CMP stop material 160, or the material removal operation may be timed to stop at the desired depth after at least substantially removing the materials as desired. In embodiments in which the material removal operation is tailored to not substantially remove portions of the CMP stop material 160, the CMP stop material 160 may function as an etch stop material.

The material removal operation used to form the peripheral trenches 176 in the peripheral region 102 may be the same material removal operation used to form the second array trenches 174 in the array region 104. Thus, in some embodiments, the peripheral trenches 176 and the second array trenches 174 may be formed simultaneously. In other embodiments, the material removal operation used to form the peripheral trenches 176 may be a different material removal operation performed at a different time than is used to form the second array trenches 174.

FIGS. 14A-14C illustrate cross-sectional views of the semiconductor device structure of FIGS. 13A-13C after a second spacer material 188 and a third filler material 190 have been formed in the second array trenches 174 and peripheral trenches 176. The second spacer material 188 may be conformally formed (e.g., deposited) within the peripheral trenches 176 (e.g., along surfaces defining the peripheral trenches 176, such as sidewalls of the conductive pads 178 and first filler material 156 and exposed surfaces of the CMP stop material 160), over upper surfaces of the conductive pads 178, within the second array trenches 174 (e.g., along surfaces defining the second array trenches 174, such as sidewalls of the conductive lines 182, cell contact material 152, cell adhesion material 154, memory cell material 150, second filler material 166, and first spacer material 164 and exposed surfaces of the heating element isolation material 146), and over upper surfaces of the conductive lines 182. By way of example and not limitation, the second spacer material 188 may be the same or a similar material as the first spacer material 164 formed in the first array trenches 162 (see FIG. 9C), such as a dielectric material (e.g., a nitride material, a silicon nitride material).

The third filler material 190 may then be formed over the second spacer material 188 to at least substantially fill the peripheral trenches 176 and the second array trenches 174. The third filler material 190 may be a dielectric material, such as an oxide (e.g., silicon oxide) or a nitride (e.g., silicon nitride) material. The material of the third filler material 190 may be the same or a similar material as the second filler material 166, or the third filler material 190 may be different than the second filler material 166.

Upon formation of the third filler material 190, excess third filler material 190 may also at least partially cover the second spacer material 188 over the conductive pads 178 and over the conductive lines 182. Such excess third filler material 190 may be removed from the second spacer material 188 over the conductive pads 178 and over the conductive lines 182, as shown in FIGS. 14A-14C. For example, a planarization operation (e.g., a CMP operation) may be performed to remove the excess third filler material 190, leaving the third filler material 190 only within the peripheral trenches 176 and the second array trenches 174.

In some embodiments, the planarization operation employed to remove the excess third filler material 190 may utilize upper surfaces of the second spacer material 188 as a stop material, as shown in FIGS. 14A-14C. In other embodiments, the planarization operation may utilize upper surfaces of the conductive pads 178 and conductive lines 182 as a stop material. In either case, the upper surface area of the conductive pads 178 and conductive lines 182, which correlates to the upper surface area of the second spacer material 188, provides a sufficiently large planarization (e.g., CMP) stop material to enable improved planarization uniformity compared to conventional methods lacking the conductive pads 178 (e.g., at the time of planarization performed over the fully defined memory cells 184). Such improved planarization uniformity may reduce or even eliminate the occurrence of over-planarization or under-planarization and resulting failures.

FIGS. 15A-15C illustrate cross-sectional views of the semiconductor device structure of FIGS. 14A-14C after a blocking material 192 and an upper contact isolation material 194 have been formed over the structure. The blocking material 192 may be or include, for example, a nitride (e.g., silicon nitride) material, a carbide material, another low-k material, or a combination thereof. The blocking material 192 may be present to protect features and materials (e.g., the memory cells 184) below the blocking material 192 from contamination that may otherwise occur due to migration of materials (e.g., ions) from upper conductive contacts to be formed. The blocking material 192 may be formed over the third filler material 190 and over the conductive pads 178 and conductive lines 182 and, optionally, over the second spacer material 188 (if present over the conductive pads 178 and conductive lines 182 after the planarization described above in relation to FIGS. 14A-14C). The upper contact isolation material 194 may be formed over the blocking material 192 and may be a dielectric material, such as, for example, an oxide material (e.g., a silicon oxide material).

Figures 16A, 16B, 16C:
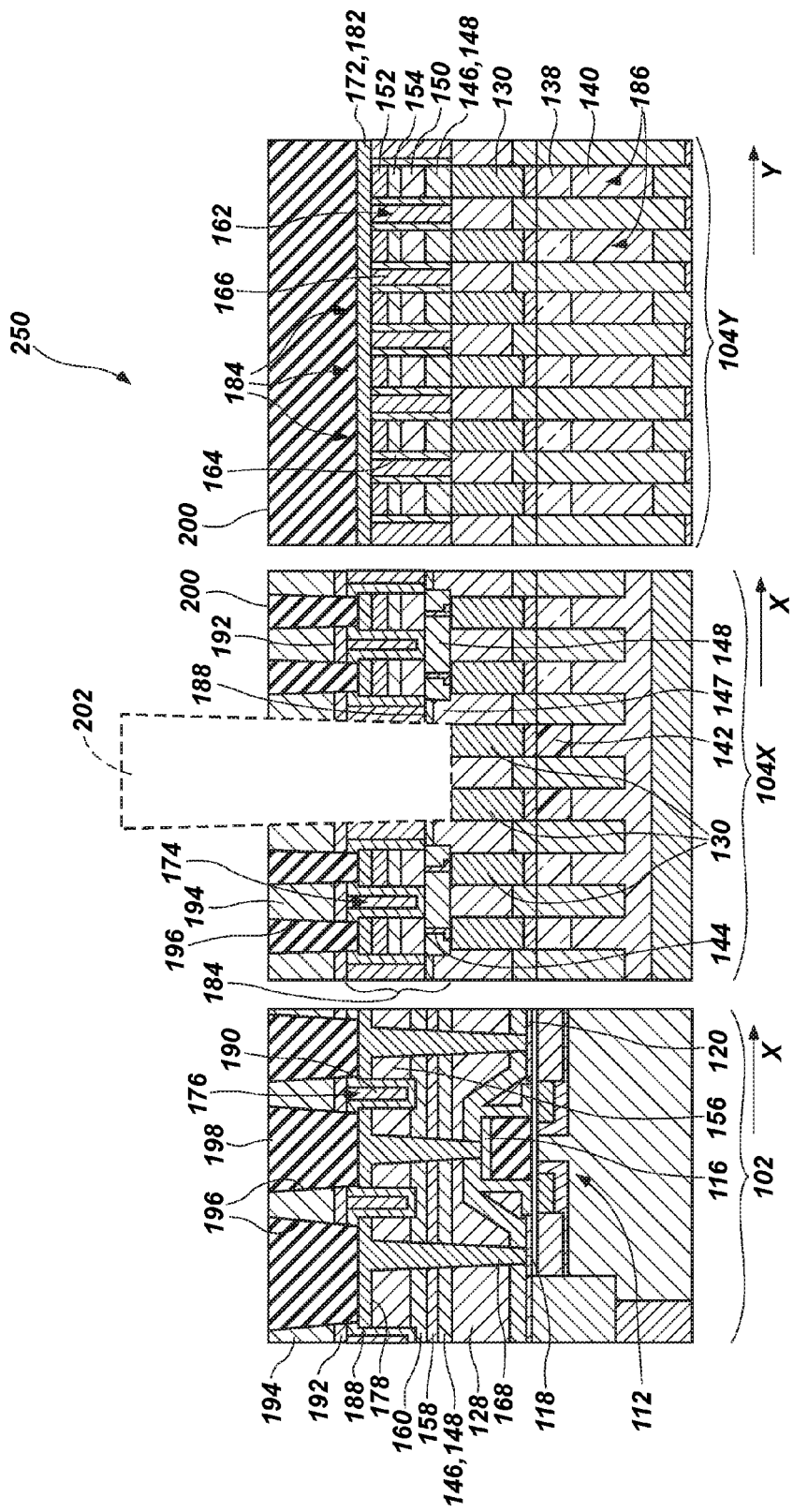

FIGS. 16A-16C illustrate cross-sectional views of the semiconductor device structure of FIGS. 15A-15C after upper conductive contacts 198, 200 have been formed. The semiconductor device structure of FIGS. 16A-16C may be a portion of a complete semiconductor device 250.

To form the upper conductive contacts (including upper peripheral conductive contacts 198 and upper array conductive contacts 200), upper contact openings 196 may be formed through the upper contact isolation material 194, blocking material 192, and second spacer material 188 (if present over the conductive pads 178 and/or conductive lines 182) to the conductive pads 178 and conductive lines 182. The upper contact openings 196 may be formed by selectively removing portions of the upper contact isolation material 194, blocking material 192, and second spacer material 188 (if present) through a mask, such as by performing an anisotropic etching operation. The material of the conductive pads 178 and of the conductive lines 182 may provide etch selectivity compared to the upper contact isolation material 194, blocking material 192, and second spacer material 188, such that the conductive pads 178 and the conductive lines 182 may function as an etch stop material for improved etch control. Furthermore, the conductive pads 178 may provide a relatively larger upper surface area than the peripheral conductive contacts 168 alone, which may simplify tolerances and alignment of the upper contact openings 196 with the underlying features. In addition, the increased surface area of the conductive pads 178 may provide increased contact area for sufficient ohmic contact between the upper peripheral conductive contacts 198 and the conductive pads 178.

The upper contact openings 196 may be at least partially filled with a conductive material (e.g., copper, tungsten, titanium) to form the upper conductive contacts 198, 200. As shown in FIGS. 16A-16C, the upper conductive contacts 198, 200 may be in the form of lines (as the upper array conductive contacts 200 are shown in the array region 104), plugs (as the upper peripheral conductive contacts 198 are shown in the peripheral region 102), or both. The upper array conductive contacts 200 may function as digit lines (e.g., bit lines) together with the conductive lines 182. The upper peripheral conductive contacts 198 may function as contacts for operating peripheral features, such as the transistor 112. Additionally or alternatively, at least some of the upper peripheral conductive contacts 198 may be operatively connected to array features (e.g., the memory cells 184) to operate the array features (e.g., to transmit an electrical signal to or receive an electrical signal from the array features).

In some embodiments, one or more memory string contacts 202 may be formed in a manner similar to the upper conductive contacts 198, 200 and coupled to one or more of the strings 186 of memory cells 184. Of course, as one of ordinary skill in the art will appreciate, additional operations may be performed to form the one or more memory string contacts 202, such as forming another dielectric filler material over the upper contact isolation material 194 and over the upper conductive contacts 198, 200 and forming one or more contact openings through the another dielectric filler material. By way of example and not limitation, as shown in FIG. 16B, a single memory string contact 202, as shown by dashed line, may be formed and coupled to the two lower conductive contacts 130 shown in the center of the x-array 104X. Alternatively, two separate memory string contacts 202 may be formed and respectively coupled to the two central lower conductive contacts 130.

Accordingly, in some embodiments of the present disclosure, methods of forming a semiconductor device may include forming a memory cell material in a peripheral region and in an array region of a semiconductor device structure. The memory cell material may be removed from the peripheral region. After removing the memory cell material from the peripheral region, portions of the memory cell material may be removed from the array region to define individual memory cells in the array region.

In additional embodiments, the present disclosure includes methods of forming a semiconductor device structure. In accordance with such methods, a conductive pad material may be formed, coupled to peripheral conductive contacts in a peripheral region of the semiconductor device structure, and coupled to a memory cell material in an array region of the semiconductor device structure. Portions of the conductive pad material may be selectively removed to define conductive pads in the peripheral region and to define conductive lines in the array region. A spacer material may be formed over the conductive pads and conductive lines, and the semiconductor device structure may be planarized using at least one of the conductive pad material and conductive lines, and the spacer material as a planarization stop material.

Further embodiments of the present disclosure include methods of forming a phase change memory device, including forming a phase change memory cell material in an array region. First array trenches may be formed and may extend in a first direction through the phase change memory cell material to partially define phase change memory cells in the array region. After forming the first array trenches, peripheral conductive contacts may be formed and coupled to respective portions of a peripheral transistor. After forming the peripheral conductive contacts, second array trenches may be formed an may extend in a second direction different from the first direction through the phase change memory cell material to fully define the phase change memory cells in the array region.

As shown in FIGS. 16A-16C, the semiconductor device 250 of the present disclosure may include the peripheral region 102 and the array region 104. The peripheral region 102 may include peripheral features, such as one or more transistors 112, configured to control and/or operate features in the array region 104. In addition, the peripheral region 102 may include the peripheral conductive contacts 168 respectively coupled to the gate contact material 116, the source contact material 118, and the drain contact material 120. The peripheral conductive contacts 168 may extend through one or more of the dielectric material 128, the heating element isolation material 146 (e.g., the nitride material 148), the etch stop material 158, the CMP stop material 160, and the first filler material 156. The conductive pads 178, which may have an upper surface area greater than an upper surface area of the respective peripheral conductive contacts 168, may be coupled to the peripheral conductive contacts 168. The conductive pads 178 may be positioned over the first filler material 156, defined by peripheral trenches 176, and isolated from one another and the second spacer material 188 and third filler material 190 within the peripheral trenches 176. The upper peripheral conductive contact 198 may be coupled to the conductive pads 178 and may be isolated from one another by the blocking material 192 and the upper contact isolation material 194.

In the array region 104, the memory cells 184 (e.g., phase change memory cells) may include the respective heating elements 144, the memory cell materials 150 (e.g., phase change memory cell materials) coupled to the heating elements 144, and the cell adhesion materials 154 and/or the cell contact materials 152 coupled to the memory cell materials 150. The heating element isolation material 146, which may include one or both of the oxide material 147 and the nitride material 148, may electrically isolate the heating elements 144 from one another. Each of the memory cells 184 may be coupled to a respective one of the lower conductive contacts 130. Strings 186 of the memory cells 184 may be defined by memory cells 184 that are coupled to a common second doped portion 140 through the first doped portions 138 and that are aligned in a first direction (e.g., the x-direction). The third doped portions 142 may also be coupled to the strings 186 and respective lower conductive contacts 130 for selecting and accessing the strings 186, such as by using the one or more memory string contacts 202 coupled to the third doped portions 142 through the respective lower conductive contacts 130. The conductive lines 182 (e.g., digit lines, bit lines) may be coupled to memory cells 184 aligned in a second direction (e.g., the y-direction) through the respective cell contact materials 152. The conductive lines 182 may be at least substantially coplanar with the conductive pads 178, and may be formed of the same conductive material as the conductive pads 178. The memory cells 184 may be isolated from one another by the first spacer material 164 and the second filler material 166 within the first array trenches 162, which may extend in the x-direction, as well as by the second spacer material 188 and the third filler material 190 within the second array trenches 174, which may extend in the y-direction. The upper array conductive contacts 200 may be coupled to the conductive lines 182 and may be isolated from each other by the second spacer material 188, blocking material 192, and upper contact isolation material 194.

Accordingly, embodiments of the present disclosure include semiconductor device structures including a peripheral region and an array region. The peripheral region may include peripheral conductive contacts coupled to at least one transistor, conductive pads comprising a conductive material, the conductive pads coupled to respective peripheral conductive contacts, the conductive pads each having an upper surface area greater than an upper surface area of a peripheral conductive contact coupled thereto, and peripheral trenches separating the conductive pads. The array region may include an array of memory cells and conductive lines each coupled to memory cells of the array of memory cells, the conductive lines comprising the same conductive material as the conductive pads in the peripheral region.

Additional embodiments of the present disclosure include phase change memory devices. The phase change memory devices according to such embodiments may include phase change memory cells comprising phase change memory cell materials electrically isolated from one another in a first direction by first trenches and in a second direction by second trenches. Conductive lines may be coupled to phase change memory cells aligned in the second direction. Peripheral conductive pads may be coupled to peripheral conductive contacts, the peripheral conductive pads coplanar with the conductive lines.

Embodiments of the present disclosure may enable improved uniformity of planarization of semiconductor device structures such as those with an array region having relatively densely packed features and peripheral regions having relatively less densely packed features. For example, conductive pads formed in the peripheral regions and conductive lines formed in the array regions may provide a relatively larger surface area of a material that functions as a CMP stop material. The improved uniformity of planarization may reduce or even eliminate failures due to over-planarization or under-planarization in the manufacturing of conventional structures. The conductive pads may also provide a relatively larger surface area for upper conductive contacts to be coupled thereto, compared to conventional structures that include upper conductive contacts coupled directly to lower conductive contacts without relatively larger conductive pads.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. A semiconductor device, comprising:
   conductive pads in a peripheral region of a semiconductor device structure, the conductive pads comprising a conductive material and isolated from adjacent conductive pads by a spacer material and a dielectric material, each of the spacer material and the dielectric material at least partially in peripheral trenches; and
   conductive lines extending across at least a portion of an array region of the semiconductor device structure, the conductive lines comprising the same conductive material as the conductive pads in the peripheral region.

2. The semiconductor device of claim 1, wherein upper surfaces of the conductive pads are coplanar with upper surfaces of the conductive lines.

3. The semiconductor device of claim 1, wherein the spacer material is located over upper surfaces and sidewalls of the conductive pads.

4. The semiconductor device of claim 1, wherein the spacer material comprises a nitride material or an oxide material.

5. The semiconductor device of claim 1, wherein the dielectric material is located over the spacer material.

6. The semiconductor device of claim 1, wherein the dielectric material comprises a nitride material or an oxide material.

7. The semiconductor device of claim 1, further comprising array trenches isolating adjacent conductive lines from one another.

8. The semiconductor device of claim 7, wherein the spacer material and the dielectric material are at least partially in the array trenches.

9. The semiconductor device of claim 1, wherein each of the conductive pads has a surface area greater than a surface area of a conductive contact overlying the conductive pad.

10. The semiconductor device of claim 9, wherein the conductive contact overlying each of the conductive pads comprises a line or a plug.

11. A method of forming a semiconductor device, comprising:

removing portions of a conductive material to define conductive pads in a peripheral region of a semiconductor device structure and to define conductive lines in an array region of the semiconductor device structure;

isolating each of the conductive pads from adjacent conductive pads in the peripheral region, comprising:
- forming a spacer material at least partially in peripheral trenches and over the conductive pads and the conductive lines; and
- forming a dielectric material at least partially in the peripheral trenches and in contact with the spacer material; and removing a portion of the dielectric material using the spacer material or at least one of the conductive pads or conductive lines as an etch stop material.

12. The method of claim 11, wherein removing portions of the conductive material to define the conductive pads in the peripheral region and to define the conductive lines in the array region comprises simultaneously forming the conductive pads in the peripheral region and the conductive lines in the array region.

13. The method of claim 11, wherein removing portions of the conductive material to define the conductive pads in the peripheral region and to define the conductive lines in the array region comprises forming the peripheral trenches defining the conductive pads in the peripheral region and array trenches defining the conductive lines in the array region.

14. The method of claim 13, wherein forming the peripheral trenches defining the conductive pads in the peripheral region and the array trenches defining the conductive lines in the array region comprises forming the array trenches of different sizes.

15. The method of claim 13, wherein forming the spacer material over the conductive pads and the conductive lines and forming the dielectric material in contact with the spacer material comprises forming the spacer material and the dielectric material in the array trenches.

16. The method of claim 11, wherein forming the spacer material over the conductive pads and the conductive lines comprises conformally forming the spacer material over the conductive pads and the conductive lines.

17. The method of claim 11, further comprising forming conductive contacts coupled to the conductive pads and the conductive lines.

18. The method of claim 17, wherein forming the conductive contacts coupled to the conductive pads and the conductive lines comprises forming the conductive contacts overlying the conductive pads and the conductive lines.

* * * * *

UNITED STATES PATENT AND TRADEMARK OFFICE
CERTIFICATE OF CORRECTION

PATENT NO. : 9,728,449 B2  
APPLICATION NO. : 15/080060  
DATED : August 8, 2017  
INVENTOR(S) : Giulio Albini Page 1 of 1

It is certified that error appears in the above-identified patent and that said Letters Patent is hereby corrected as shown below:

On the Title Page

In ITEM (73) Assignee:   change "Micro Technology, Inc., Boise ID (US)"  
to --Micron Technology, Inc., Boise ID (US)--

In the Specification

Column 9,   Line 28,   change "by foil ling a" to --by forming a--

Signed and Sealed this  
Nineteenth Day of September, 2017

Joseph Matal  
*Performing the Functions and Duties of the*  
*Under Secretary of Commerce for Intellectual Property and*  
*Director of the United States Patent and Trademark Office*